United States Patent
Chang et al.

(10) Patent No.: US 10,840,182 B2
(45) Date of Patent: Nov. 17, 2020

(54) METHOD OF FORMING SEMICONDUCTOR MEMORY DEVICE WITH BIT LINE CONTACT STRUCTURE

(71) Applicants: UNITED MICROELECTRONICS CORP., Hsin-Chu (TW); Fujian Jinhua Integrated Circuit Co., Ltd., Quanzhou (CN)

(72) Inventors: Feng-Yi Chang, Tainan (TW); Shih-Fang Tzou, Tainan (TW); Yu-Cheng Tung, Kaohsiung (TW); Fu-Che Lee, Taichung (TW); Ming-Feng Kuo, Tainan (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/188,237

(22) Filed: Nov. 12, 2018

(65) Prior Publication Data
US 2019/0080961 A1    Mar. 14, 2019

Related U.S. Application Data

(62) Division of application No. 15/472,295, filed on Mar. 29, 2017, now Pat. No. 10,170,362.

(30) Foreign Application Priority Data

Feb. 23, 2017   (CN) .......................... 2017 1 0099769

(51) Int. Cl.
*H01L 27/10* (2006.01)
*H01L 23/528* (2006.01)
(Continued)

(52) U.S. Cl.
CPC ...... *H01L 23/528* (2013.01); *H01L 21/76224* (2013.01); *H01L 27/10888* (2013.01); *H01L 29/0649* (2013.01); *H01L 27/10894* (2013.01)

(58) Field of Classification Search
CPC ......... H01L 21/76895; H01L 21/31116; H01L 29/0649; H01L 23/535; H01L 21/02063;
(Continued)

(56) References Cited

U.S. PATENT DOCUMENTS 8,581,337 B2   11/2013  Kye
8,895,432 B2   11/2014  Chang
(Continued)

FOREIGN PATENT DOCUMENTS

CN          103107160 A     5/2013

OTHER PUBLICATIONS

Wu, Research on Etching Process for forming Shallow Trench Isolation of Integrated Circuit, China Masters' Theses Full-text Database, issue 11, 2009, cover page & pp. 1-46.

*Primary Examiner* — Ismail A Muse
(74) *Attorney, Agent, or Firm* — Winston Hsu (57) ABSTRACT

The present invention provides a method of forming a semiconductor device. First, a substrate is provided and an STI is forming in the substrate to define a plurality of active regions. Then a first etching process is performed to form a bit line contact opening, which is corresponding to one of the active regions. A second etching process is performed to remove a part of the active region and its adjacent STI so a top surface of active region is higher than a top surface of the STI. Next, a bit line contact is formed in the opening. The present invention further provides a semiconductor structure.

13 Claims, 7 Drawing Sheets

(51) Int. Cl.
*H01L 21/762* (2006.01)
*H01L 29/06* (2006.01)
*H01L 27/108* (2006.01)

(58) Field of Classification Search
CPC ......... H01L 21/31144; H01L 21/76224; H01L 21/76849; H01L 21/76814; H01L 21/76805; H01L 27/10888; H01L 27/10894
See application file for complete search history.

(56) References Cited

U.S. PATENT DOCUMENTS

| | | | |
|---|---|---|---|
| 2003/0005881 A1* | 1/2003 | Shin | H01L 21/28525 |
| | | | 117/97 |
| 2008/0090378 A1 | 4/2008 | Tsunoda | |
| 2009/0001445 A1 | 1/2009 | Park | |
| 2009/0267126 A1* | 10/2009 | Wang | H01L 21/82343 |
| | | | 257/302 |
| 2011/0037142 A1* | 2/2011 | Huang | H01L 21/76254 |
| | | | 257/510 |
| 2012/0289050 A1 | 11/2012 | Wu | |
| 2014/0154879 A1* | 6/2014 | Akram | H01L 21/288 |
| | | | 438/629 |
| 2015/0371889 A1 | 12/2015 | Kim | |
| 2016/0027727 A1 | 1/2016 | Kim | |
| 2016/0035731 A1* | 2/2016 | Lee | H01L 27/10823 |
| | | | 257/334 |
| 2017/0005166 A1* | 1/2017 | Park | H01L 29/0649 |

\* cited by examiner

METHOD OF FORMING SEMICONDUCTOR MEMORY DEVICE WITH BIT LINE CONTACT STRUCTURE

CROSS REFERENCE TO RELATED APPLICATIONS

This is a divisional application of U.S. patent application Ser. No. 15/472,295 filed on Mar. 29, 2017, which is incorporated herein by reference in its entirety.

BACKGROUND OF THE INVENTION

1. Field of the Invention

The present invention is related to a method of forming a memory semiconductor device, and more particularly, to a memory semiconductor device with bit line contact opening.

2. Description of the Prior Art

As technology advances, integrated circuit process technology also continues to improve, so a variety of electronic circuits can be accumulated/formed on a single wafer. The semiconductor manufacturing process for manufacturing a wafer includes a number of steps such as a deposition process for forming a thin film, a photoresist coating for patterning said photoresist, an exposure and development process, and an etching process for patterning the film. To meet requirement, the size of the circuit elements on the wafer is continuously downsizing, and for each of the above-described process of routing an allowable range (process window) requirements are increasingly stringent. Therefore, how to increase the permissible range of the process in order to achieve the effect of improving the yield of production has been the target of the industry.

SUMMARY OF THE INVENTION

The present invention provides a method of forming a semiconductor memory device having bit line contact with good quality.

According to one embodiment, the present invention provides a method of forming a semiconductor memory device. First, a substrate is provided and an STI is forming in the substrate to define a plurality of active regions. Then a first etching process is performed to form a bit line contact opening, which is corresponding to one of the active regions. A second etching process is performed to remove a part of the active region and its adjacent STI so a top surface of active region is higher than a top surface of the STI. Next, a bit line contact structure is formed in the opening.

According to another embodiment, the present invention provides a semiconductor structure, including a substrate, a shallow trench isolation, a bit line contact opening, a bit line contact structure and a spacer. The substrate has a first active region and a plurality of second active regions. The shallow trench isolation is disposed in the substrate and between the first active region and the second active regions. The bit line contact opening is disposed in the first active region and the shallow trench isolation. The bit line contact structure is disposed in the bit line contact opening and contacts the first active region. The spacer is disposed in the bit line contact opening, wherein the spacer has a sidewall directly contacting one of the second active regions.

The present invention provides a method of forming a bit line contact, including performing a first etching process, a second etching process and a third etching process, respectively. The first etching process is to form the opening, the second etching process ensures the quality of the active region, and the third etching process enhances the structural stability of the bit line.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
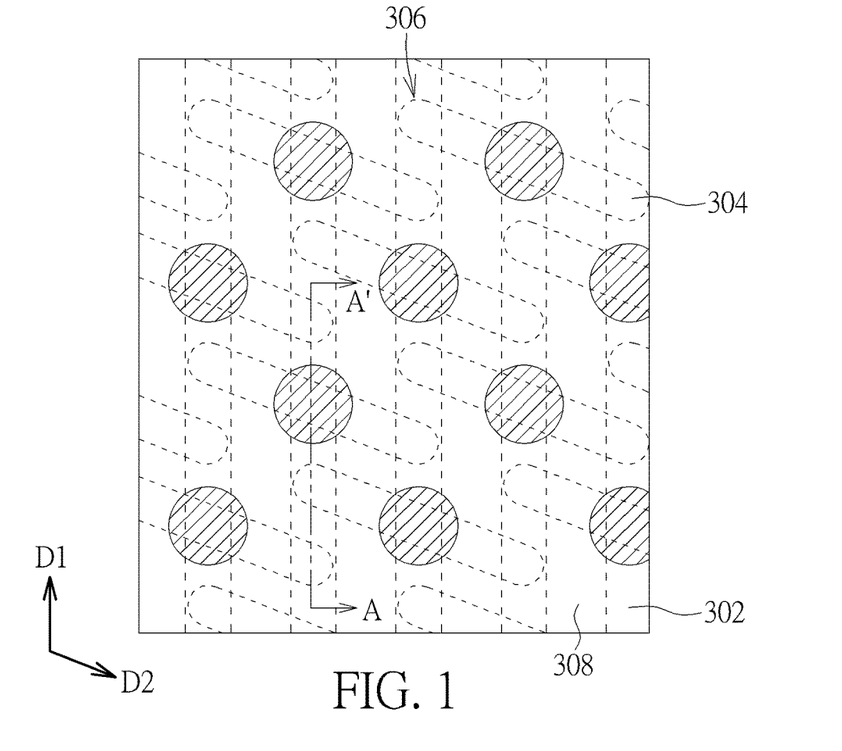
FIG. 1 to FIG. 8 show schematic diagram of the method of manufacturing a semiconductor memory device according to a first embodiment of the present invention.
Figure 2:
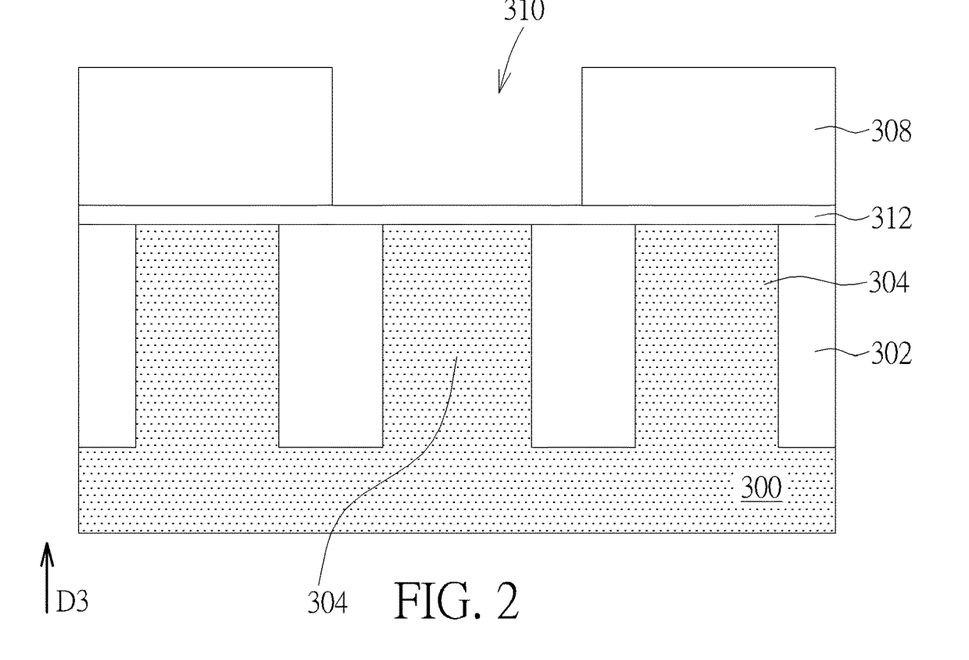

Please refer to FIG. 1 to FIG. 8, which show schematic diagram of the method of manufacturing a semiconductor memory device according to the first embodiment of the present invention, wherein FIG. 1 shows a top view and FIG. 2 to FIG. 7 are cross-sectional schematic view taken along line AA' in FIG. 1. The present embodiment provides a method for manufacturing a semiconductor memory device comprising the steps. First, as shown in FIG. 1 and FIG. 2, a substrate 300 is provided. The substrate 300 can be any component that can serve as a base for forming devices. In one embodiment, the substrate 300 can comprise a semiconductor material, such as a silicon substrate, an epitaxial silicon substrate, a silicon germanium substrate, a silicon carbide substrate, a single crystal silicon substrate, a single crystal silicon germanium substrate, an amorphous silicon substrate, or a silicon on insulator (SOI), but it is not limited thereto. In a cell region, a shallow trench isolation (STI) 302 is formed to define a plurality of active regions 304. The shallow trench isolation 302 may be formed by forming a plurality of trenches (not shown) in the semiconductor substrate 300 by an etching process, and filling in the trench with insulating material such as silicon oxide ($SiO_2$) or silicon oxide nitrogen (SiN) or other insulation material. In addition, a plurality of word lines 306 may be formed on the substrate 300, and in the present embodiment the word lines 306 are buried word lines, but are not so limited thereto. In some embodiments, each of the word line 306 may extend along a first direction D1, and each of the active regions 304 may extend along a second direction D2 different from the first direction D1. In addition, the second direction D2 may not be orthogonal to the first direction D1, and each of the active regions 304 may extend along an oblique direction, thereby increasing the density of memory cells.

A patterned mask layer 308 is formed after forming the shallow trench isolation 302 and the word lines 306. A patterned mask layer 308 may comprise a plurality of openings 310 respectively corresponding to the portion of the active region 304 to define the position of bit line contacts in the subsequent step, and the sidewall of the openings 310 are positioned above the shallow trench isolation 302 and preferably at the center of the shallow trench isolation 302. In one embodiment, before forming the patterned mask layer 308, a mask layer 312 can be formed on the substrate and the shallow trench isolation 302. In one embodiment, the mask layer 312 may include an insulating material such as silicon nitride, and the patterned mask layer 308 may comprise photoresist, but not limited thereto.

Figure 3:
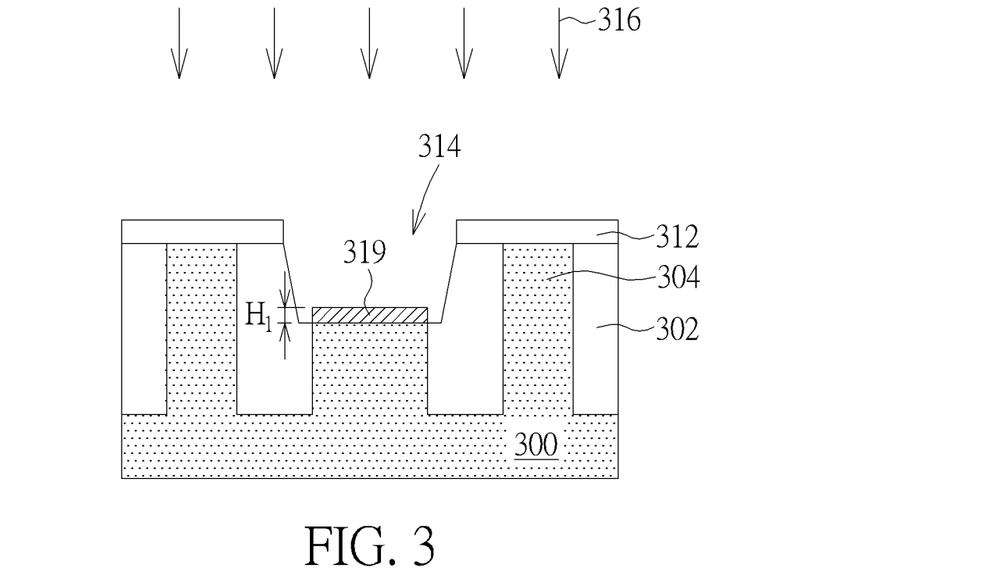

As shown in FIG. 3, a first etching process is performed by using the patterned mask layer 308 as a mask to form an opening 300 in the substrate 300. The opening 314 preferably has an inclined side wall corresponding to the shallow trench isolation 302, while the bottom surface of the opening 314 is composed by the shallow trench isolation 302 and located in the middle of the active region 304. In the preferred embodiment of the invention, the first etching process 316 is a dry etching process, the etching gas includes, for example, carbon tetrafluoride ($CF_4$), trifluoromethane ($CHF_3$), chlorine ($Cl_2$), sulfur hexafluoride ($SF_6$), octafluorocyclobutane ($C_4F_8$) or hexafluoro butadiene ($C_4F_6$), but is not limited thereto. After performing the first etching process 316, there may be Si residue 319 formed on the upper surface 304 of the exposed active region (including a top surface and the sidewall). The exposed active region 304 has a height $H_1$. Then, the patterned mask layer 308 is removed.

Figure 4:
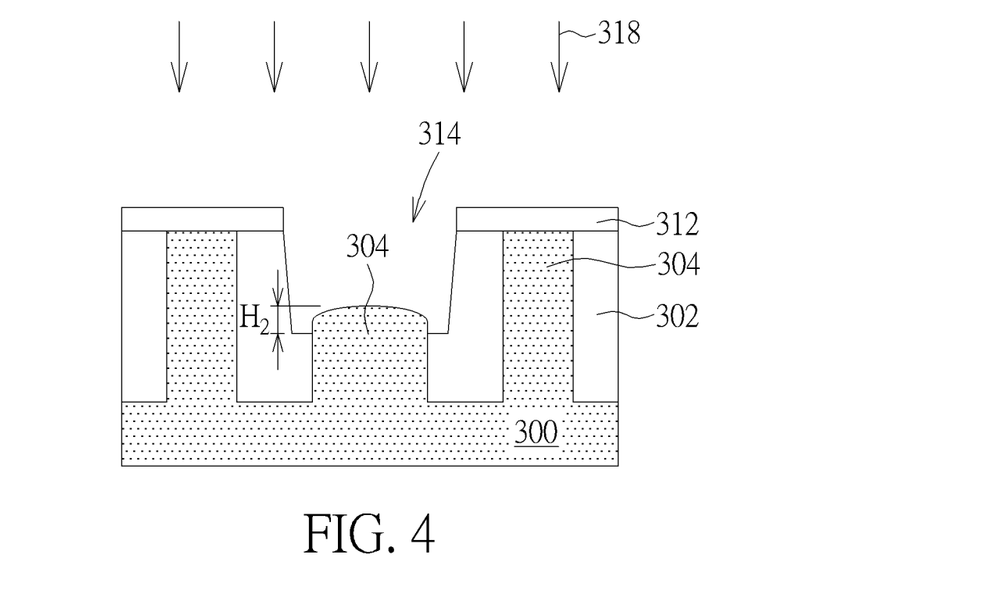
Figure 5:
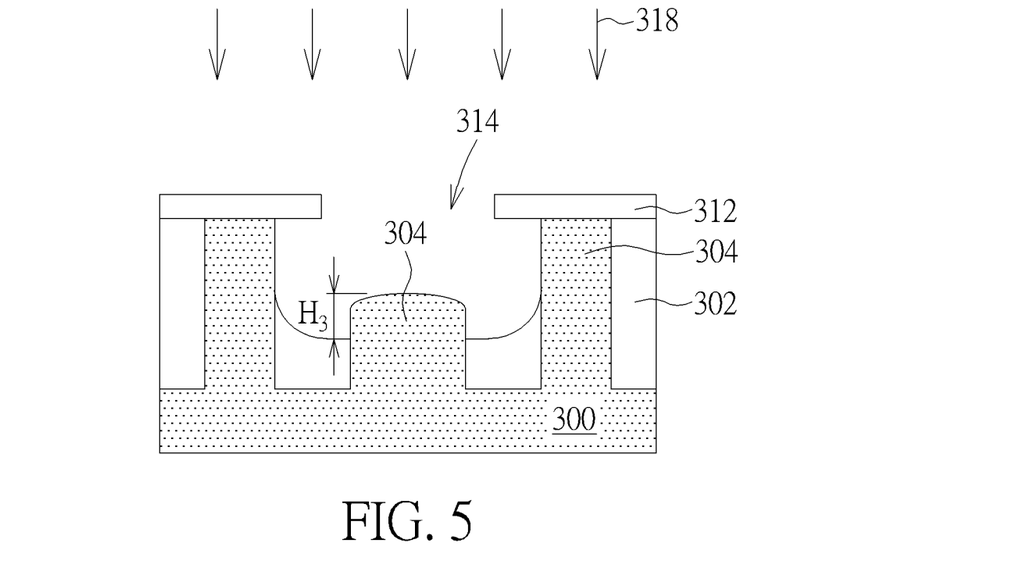
Figure 6:
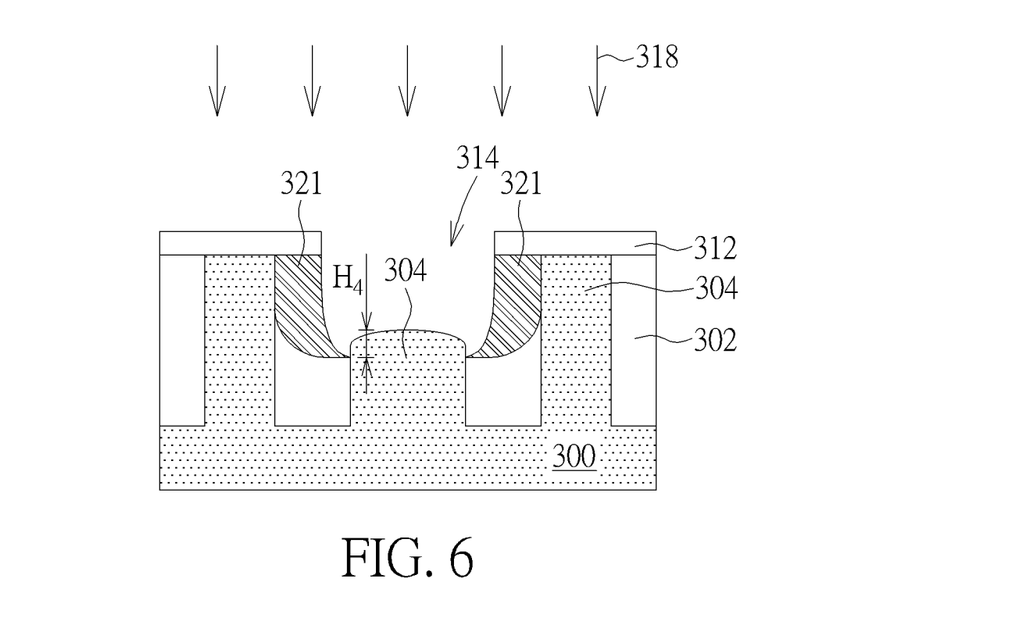

As shown in FIG. 4, a second etching process 318 is then performed and the Si residue 319 is completely removed from the upper surface of the exposed active region 304. In one embodiment, the second etch process 318 is to use vapor etching gas, such as hydrofluoric acid (HF) without plasma. In another embodiment, the second etch process 318 can use plasma etching gas, such as ammonia ($NH_3$) or nitrogen trifluoride ($NF_3$), and preferably is ion bombard free. And in another embodiment, a wet etching may also be used, e.g., using a dilute hydrofluoric acid (dHF). After performing a second etching process 318, a part of the shallow trench isolation around 302 the active region 304 is also removed, thereto expose the sidewalls and the top surface of the active region 304 in the opening 314, so the top surface of the active region 304 is slightly higher than the top surface of the shallow trench isolation 302 in order to increase the stability of the subsequently formed bit line contact. In this embodiment, the active region 304 having a height $H_2$ (the distance between the top surface of the active region 304 and the top surface of the shallow trench isolation 302), and $H_2$ is greater than $H_1$. In another embodiment of the present invention, as shown in FIG. 5, the shallow trench isolation 302 may further be etched, so the sidewall of the opening 314 would be located below the mask layer 312. And the surface of the shallow trench isolation 312 would further be etched, so that the height of the exposed active region 304 $H_3$ is greater than the $H_2$. And in still another embodiment of the present invention, after forming the structure of FIG. 5, a spacer 321 may be formed below the mask layer 312, above the shallow trench isolation 302, and at two sidewalls of the active region 304, wherein the spacer 321 has a sidewall vertically aligned with the opening 314, as shown in FIG. 6. In one embodiment, the spacer 321 includes silicon oxide, silicon nitride, or combinations thereof. In one embodiment, the spacer 321 is formed by forming spacer material layer (not shown) on the substrate 300, which conformally fill the opening 314, and then performing a dry etching and/or wet etching process to form said spacer 321. In another embodiment, the process parameters can be adjusted, so that the sidewalls of the spacer 321 can be positioned under the mask layer 310, or can be protrude from the sidewall of the opening 314. In the present embodiment, the exposed active region 304 has a height $H_4$, wherein $H_4$ and $H_2$ is substantially equal. In one embodiment, $H_4$ may be larger than $H_3$.

Figure 7:
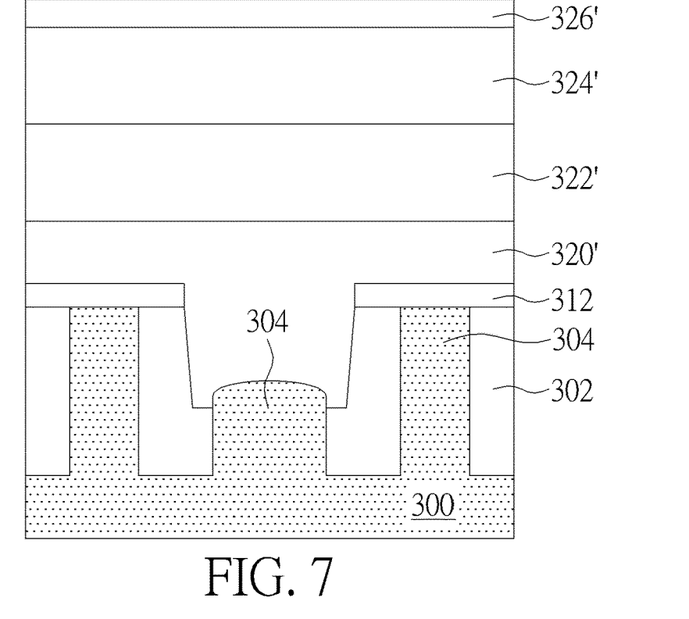

Next, as shown in FIG. 7, a plug contact layer 320', a low-resistance layer 322', a cap 324' and a mask layer 326' are the sequentially formed on the substrate 300. The contact plug layer 320' may fill the opening 314 and the material thereof contains silicon, for example, poly-silicon or amorphous silicon. The low-resistance layer 322' includes metal such as gold (Au), silver (Ag), copper (Cu), aluminum (Al), molybdenum (Mo), titanium (Ti), tantalum (Ta), cadmium (Cd), or the nitrides thereof, or the oxides thereof, or the above-mentioned alloys, or combinations thereof. The cap layer 324' and mask layer 326' may be any mask material, for example, silicon nitride (SiN), silicon oxynitride (SiON), silicon carbide (SiC) or the advanced pattern film (APF) provided by Applied Materials company, or any combination of these materials. In one embodiment, the cap layer 324' is silicon nitride, and the mask layer 326' is a silicon oxide. Moreover, a barrier layer (not shown) can be formed between the contact plug layer 320' and the low resistance layer 322'.

Figure 8:
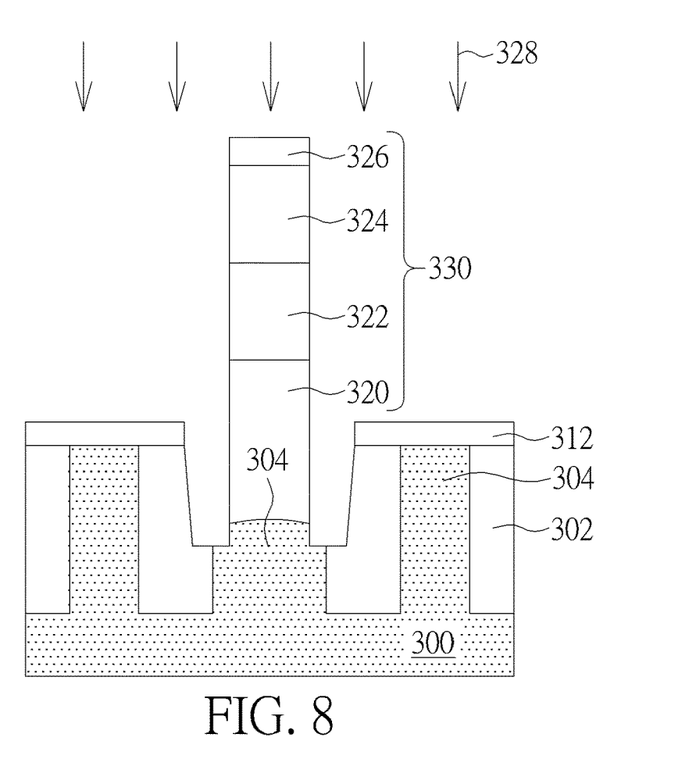

As shown in FIG. 8, a third etching process 328 is performed by using the mask layer 326' as a mask to pattern the cap layer 324', the low-resistance layer 322' and the contact plug layer 320'. Thus, the patterned mask layer 326, the patterned cap layer 324, the patterned low resistance layer 322 and the patterned contact plug layer 320 together forms a bit line contact structure 330 and a bit line. In one embodiment, the third etching process 328 further etches to a top surface of the shallow trench isolation 302 in the opening 314 so that the bit line contact sidewall 330 is substantially a 90 degree angle.

Figure 9:
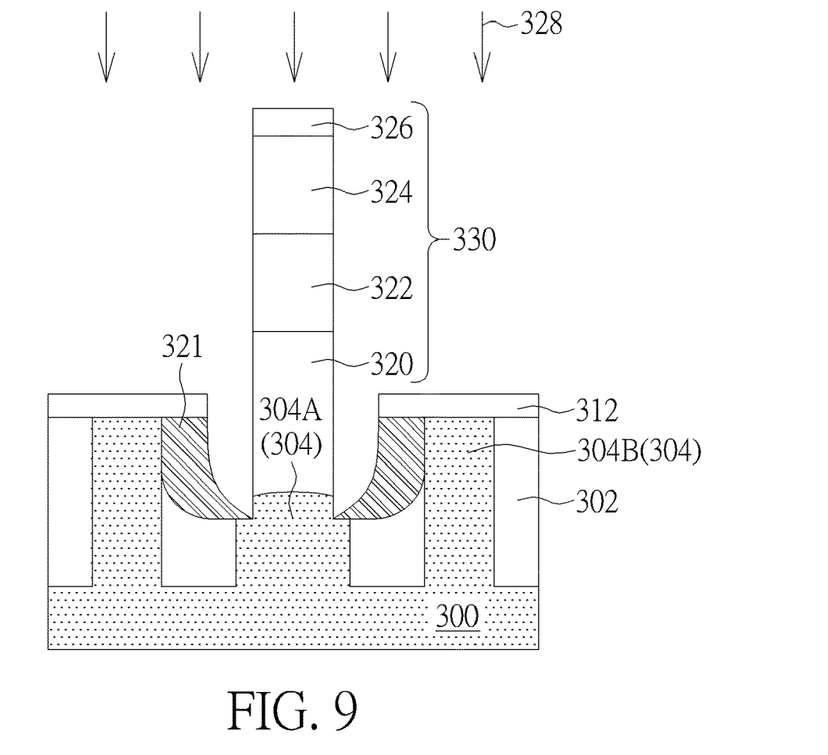
FIG. 9 shows a schematic diagram of the method of manufacturing a semiconductor memory device according to a second embodiment of the present invention.

Please refer to FIG. 9, when the embodiment with a spacer in FIG. 6 is provided, the final formation of the bit line contact structure 330 is as shown in FIG. 9. As shown in FIG. 9, this semiconductor memory structure comprises a substrate 300 having a first active region 304A and a plurality of second active regions 304B located on both sides of the first active region 304A. The shallow trench isolation 302 is disposed between the first active region 304A and the second active region 304B. The bit line contact opening 314 is provided in the first active region 304A and the shallow trench isolation 302. The bit line contact structure 330 is disposed in the bit line contact opening 314 and contacts with the first active region 304A. The spacer 321 is disposed in the bit line contact opening 314, and preferably located above the shallow trench isolation 302, below the mask layer 310, and it has a sidewall direct contacting the sidewall of the second active region 304B. In one embodiment, the spacer 321 has a sidewall under the mask layer 310. In another embodiment, the sidewall of the spacer 321 vertically aligns with the mask layer 321. In yet another embodiment, the sidewall of the spacer 321 protrudes from the side wall of the mask layer 310.

Figure 10:
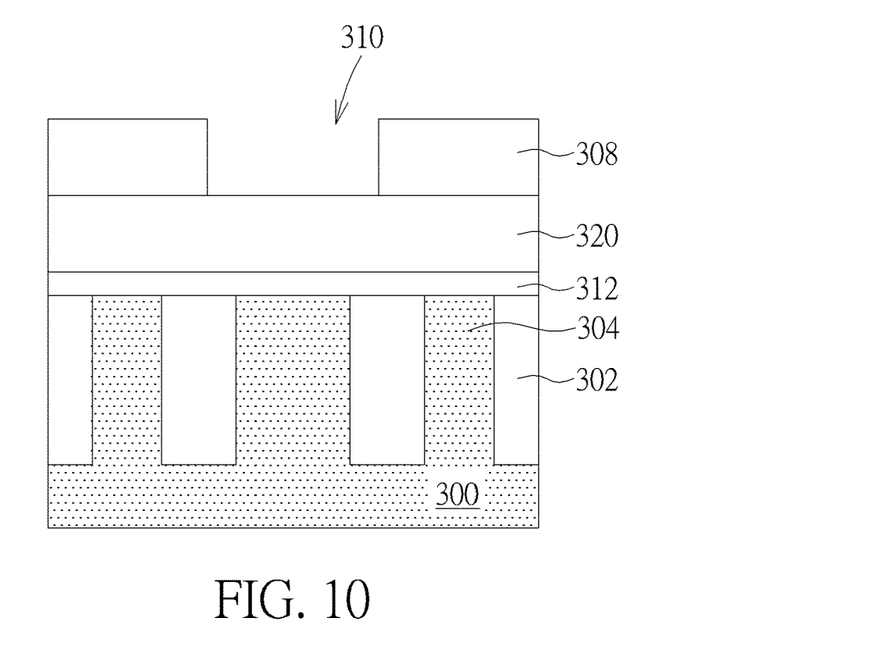
FIG. 10 to FIG. 13 show schematic diagrams of the method of manufacturing a semiconductor memory device according to third embodiment of the present invention.

Please refer to FIG. 10 to FIG. 13, which shows schematic diagrams of the method of manufacturing a semiconductor memory device according to second embodiment of the present invention. As shown in FIG. 10, a substrate 300 is provided, and then forming the shallow trench isolation 302 the active region 304 and the mask layer 310 on the substrate 300, wherein detail embodiment is the same as that in the first embodiment. Then, a first contact plug layer 320 is formed such as poly-silicon or amorphous silicon. This first contact plug layer 320' can also be used as a gate of transistor in the peripheral region, that is, in the present embodiment, the transistor gate will be formed simultaneously with the bit line contact structure in the cell region. Then, a patterned mask layer 308, for example, a photoresist layer is formed on the first contact plug layer 320.

Figure 11:
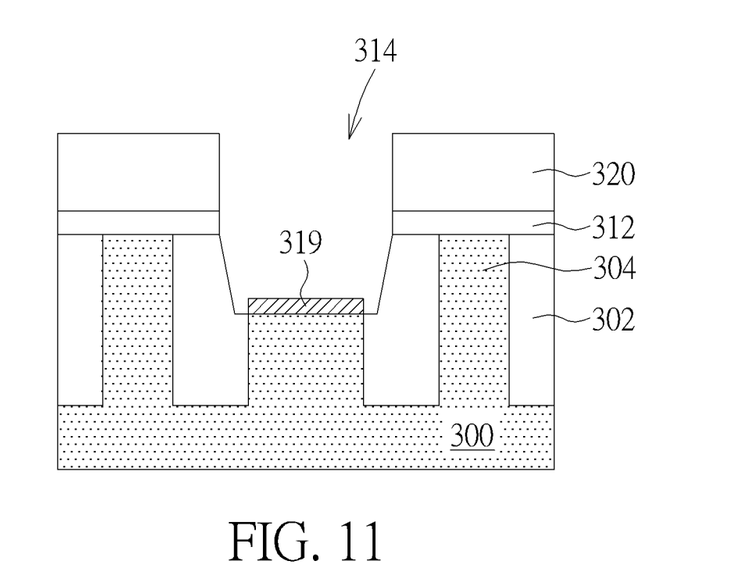
Figure 12:
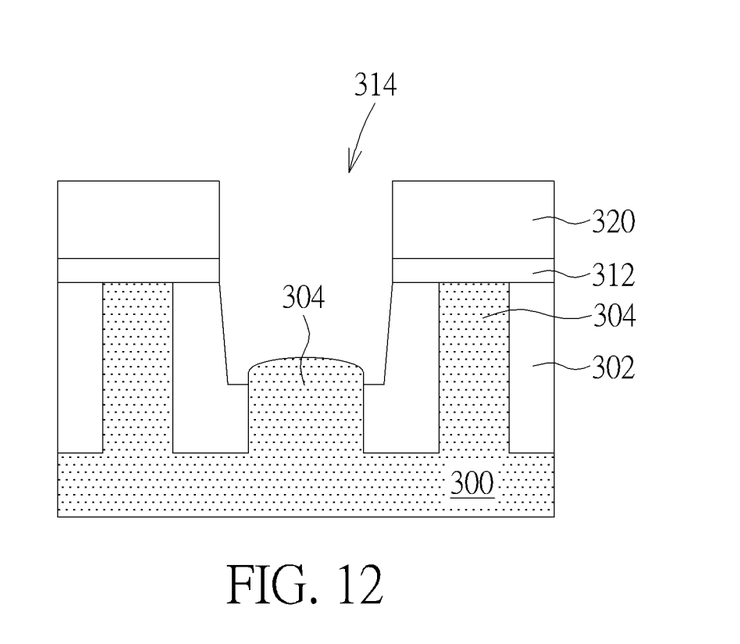
Figure 13:
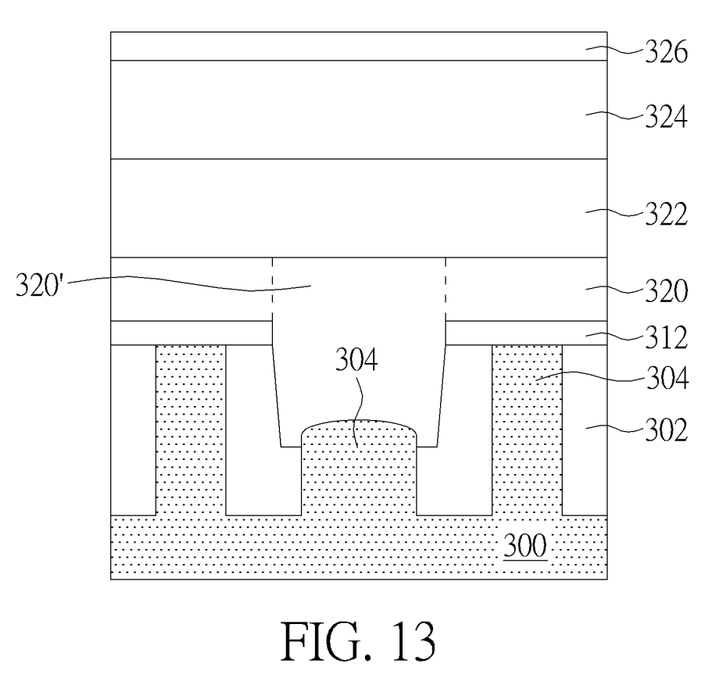

Next, as shown in FIG. 11, a first etch process 316 is performed by using the patterned mask layer 308 as a mask to form an opening 314. Thereafter, a second etching process 318 is performed. Details of the first etch process 316 and the second etching process 318 is described in the above first embodiment.

A second contact plug layer 320 is filled into the opening 314, and a planarization step is performed to make the first contact plug layer 320' level with the second contact layer plug layer 320. The first contact plug material layer 320 and the second contact plug layer 320' may have the same material or different material. A low-resistance layer 322, a cap 324, and a mask layer 326 are then formed, which is the same as that in the first embodiment. Finally, as shown in FIG. 8, the third etching process 328 is performed, and the bit line contact structure 330 and bit line can also be obtained.

In summary, the present invention provides a method of forming a bit line contact, including performing a first etching process, a second etching process and a third etching process, respectively. The first etching process is to form the opening, the second etching process ensures the quality of the active region, and the third etching process enhances the structural stability of the bit line.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor memory device, comprising:
    providing a substrate, wherein a shallow trench isolation (STI) is formed in the substrate to define a plurality of active regions;
    performing a first etching process to form a bit line contact opening, wherein the bit line contact opening corresponds to one of the active regions, and the bit line contact opening exposes said one active region and the STI surrounds the active region;
    performing a second etching process to remove a portion of the STI in the bit line contact opening, making a top surface of the active region in the bit line contact opening being exposed and higher than a top surface of the STI in the bit line contact opening;
    forming a spacer in the bit line contact opening, wherein the spacer completely covers the top surface of the STI in the bit line contact opening while the top surface of the active region is exposed from the spacer; and
    after forming the spacer, forming a bit line contact structure on the substrate, wherein the bit line contact structure is disposed in a part of the bit line contact opening and contacts the top surface of the active region in the bit line contact opening.

2. The method of forming a semiconductor memory device according to claim 1, wherein in the second etching process, further comprising removing a silicon residue on the active region in the bit line contact opening.

3. The method of forming a semiconductor memory device according to claim 1, wherein the bit line contact opening comprises a sidewall, and the sidewall extends to a same depth as a bottom surface of the shallow trench isolation.

4. The method of forming a semiconductor memory device according to claim 1, further comprising:
    forming a semiconductor layer on the substrate;
    forming a low resistance layer on the semiconductor layer; and
    patterning the semiconductor layer and the low resistance layer.

5. The method of forming a semiconductor memory device according to claim 4, wherein the bit line contact opening is formed and then the semiconductor layer is formed.

6. The method of forming a semiconductor memory device according to claim 4, wherein the semiconductor layer is formed and then the bit line contact opening is formed.

7. The method of forming a semiconductor memory device according to claim 1, before forming the bit line contact opening, further comprising forming a patterned mask layer, and the first etching process uses the patterned mask layer as a mask.

8. The method of forming a semiconductor memory device according to claim 7, the second etching process removes the STI under the patterned mask layer, making a sidewall of the bit line contact opening under the patterned mask layer.

9. The method of forming a semiconductor memory device according to claim 1, wherein the second etching process comprises using steam HF.

10. The method of forming a semiconductor memory device according to claim 1, wherein the second etching process comprises using etchant HF.

11. The method of forming a semiconductor memory device according to claim 1, wherein the second etching process comprises using plasma containing $NH_3$ or $NF_3$.

12. The method of forming a semiconductor memory device according to claim 1, wherein the first etching process comprises using etching gas with carbon tetrafluoride ($CF_4$), trifluoromethane ($CHF_3$), chlorine ($Cl_2$), sulfur hexafluoride ($SF_6$), octafluorocyclobutane ($C_4F_8$) or hexafluoro butadiene ($C_4F_6$).

13. The method of forming a semiconductor memory device according to claim 1, after the first etching process, the top surface of the active region in the bit line contact opening and the top surface of the shallow trench isolation in the bit line contact opening have a height $H_1$, after the second etching process, the top surface of the active region in the bit line contact opening and the top surface of the shallow trench isolation in the bit line contact opening have a height $H_2$, wherein $H_2$ is greater than $H_1$.

* * * * *